(12) United States Patent
Okabe et al.

(10) Patent No.: US 9,093,498 B2
(45) Date of Patent: Jul. 28, 2015

(54) METHOD FOR MANUFACTURING BONDED WAFER

(75) Inventors: Keiichi Okabe, Nagano (JP); Susumu Miyazaki, Nagano (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 1355 days.

(21) Appl. No.: 11/921,081

(22) PCT Filed: May 18, 2006

(86) PCT No.: PCT/JP2006/309892
§ 371 (c)(1),
(2), (4) Date: Nov. 27, 2007

(87) PCT Pub. No.: WO2006/129484
PCT Pub. Date: Dec. 7, 2006

(65) Prior Publication Data
US 2009/0111245 A1    Apr. 30, 2009

(30) Foreign Application Priority Data
Jun. 1, 2005    (JP) .................................. 2005-161025

(51) Int. Cl.
*H01L 21/762*        (2006.01)

(52) U.S. Cl.
CPC ................................ *H01L 21/76256* (2013.01)

(58) Field of Classification Search
CPC .................... H01L 21/76251; H01L 21/76254
USPC ................................................. 438/459, 549
See application file for complete search history.

(56) References Cited

U.S. PATENT DOCUMENTS 2,927,011 A    3/1960    Stead
6,265,328 B1   7/2001    Henley et al.
(Continued)

FOREIGN PATENT DOCUMENTS

EP    0 856 876 A2    8/1998
EP    0 964 436 A2    12/1999
(Continued)

OTHER PUBLICATIONS

Schwartz, B. et al., "Chemical Etching of Silicon," Journal of the Electrochemical Society, vol. 108, No. 4, p. 365-372 (1961).
(Continued)

*Primary Examiner* — Thao X Le
*Assistant Examiner* — Geoffrey Ida
(74) *Attorney, Agent, or Firm* — Oliff PLC

(57) ABSTRACT

The present invention provides a method for manufacturing a bonded wafer comprising steps of forming an oxide film on at least a surface of a base wafer or a surface of a bond wafer; bringing the base wafer and the bond wafer into close contact via the oxide film; subjecting these wafers to a heat treatment under an oxidizing atmosphere to bond the wafers together; grinding and removing the outer periphery of the bond wafer so that the outer periphery has a predetermined thickness; subsequently removing an unbonded portion of the outer periphery of the bond wafer by etching; and then thinning the bond wafer so that the bond wafer has a desired thickness, wherein the etching is conducted by using a mixed acid at 30° C. or less at least comprising hydrofluoric acid, nitric acid, and acetic acid. Thus there is provided a method for manufacturing a bonded wafer by which unbonded portions of the outer periphery of the bond wafer are removed with a high selectivity ratio ($R_{Si}/R_{SiO2}$) without causing metallic contamination.

2 Claims, 5 Drawing Sheets

(56) References Cited

U.S. PATENT DOCUMENTS

| | | | |
|---|---|---|---|
| 6,274,505 B1 | 8/2001 | Ito et al. | |
| 2001/0006246 A1* | 7/2001 | Kwag et al. | 257/522 |
| 2001/0055863 A1* | 12/2001 | Nakano et al. | 438/549 |
| 2003/0199165 A1* | 10/2003 | Keenan et al. | 438/689 |
| 2005/0212415 A1* | 9/2005 | Jung et al. | 313/504 |
| 2006/0110101 A1* | 5/2006 | Lin et al. | 385/16 |
| 2010/0255682 A1* | 10/2010 | Trickett et al. | 438/692 |

FOREIGN PATENT DOCUMENTS

| | | |
|---|---|---|
| EP | 0 856 876 A3 | 7/2000 |
| EP | 1 069 598 A1 | 1/2001 |
| JP | A 06-061461 | 3/1994 |
| JP | A 08-107091 | 4/1996 |
| JP | A 10-209093 | 8/1998 |
| JP | A-11-067742 | 3/1999 |
| JP | A-2000-077381 | 3/2000 |
| JP | A-2001-053257 | 2/2001 |

OTHER PUBLICATIONS

Oct. 18, 2010 Search Report issued in European Application No. 06746580.7.

Williams, K.R., "Silicon wet isotropic etch rates," Properties of Crystalline Silicon, Institution of Engineering and Technology, pp. 811-814, Jul. 1, 1998, XP009139414.

Ultraprecise Wafer Surface Control Technology, Science Forum, The First Edition, The Fourth Section, pp. 187-192, Feb. 28, 2000 with partial English translation.

Jul. 12, 2011 Notification of Reasons for Refusal issued in Japanese Application No. 2005-161025 with partial English-language translation.

Mar. 6, 2012 Notification of Reasons for Refusal issued in Japanese Application No. 2005-161025 with partial English-language translation.

Kovacs et al., "Bulk Micromachining of Silicon," Proceedings of the IEEE, vol. 86, No. 8, pp. 1536-1551, Aug. 1998.

Dec. 18, 2014 Office Action issued in European Application No. 06 746 580.7.

* cited by examiner (a)

(b)

METHOD FOR MANUFACTURING BONDED WAFER

TECHNICAL FIELD

The present invention relates to a method for manufacturing a bonded wafer, in particular to a method of etching the unbonded portion of the outer periphery of the bond wafer.

BACKGROUND ART

Bonded wafers are used as wafers for high performance devices. Each of the bonded wafers is manufactured by bonding a semiconductor wafer with another wafer or the like and then thinning the wafer on the side where devices are fabricated.

Specifically, for example, two mirror-polished silicon wafers are prepared, and an oxide film is formed at least on one of the wafers. Then these wafers are brought into close contact to each other and subjected to a heat treatment at a temperature of from 200 to 1200° C. to increase bonding strength. After that, the wafer on the side where devices are fabricated (a bond wafer) is ground, polished and the like to thin the wafer so that the bond wafer has a desired thickness. As a result, a bonded SOI wafer comprising an SOI (Silicon On Insulator) layer can be manufactured.

It should be noted that the bonded wafer can be manufactured by directly bonding silicon wafers together without interposing an oxide film therebetween. Furthermore, as the base wafer, an insulator wafer made of quartz, silicon carbide, alumina, or the like can be used.

When the bonded wafer is manufactured as mentioned above, each of two mirror-surface wafers to be bonded has a portion referred to as a polishing sag, which has a slightly thinner thickness on the periphery, and a chamfered portion. Such portions are not bonded or left as unbonded portions having weak bonding strengths. When the bond wafer is thinned by grinding or the like in the presence of such unbonded portions, the unbonded portions delaminate in part in the thinning step. Therefore, the thinned bond wafer has a smaller diameter than the wafer to be a base (a base wafer). The bond wafer also has micro unevenness continuously formed in the periphery.

When such a bonded wafer is subjected to a device process, remaining unbonded portions delaminate in the device process. This generates particles and deteriorates device yield.

In order to overcome the problems, there is proposed a method of removing the remained unbonded portions beforehand by alkaline etching using KOH, NaOH, or the like (see Japanese Patent Application Laid-open (kokai) No. 10-209093). In alkaline etching, the etching rate of an etchant against Si ($R_{Si}$) is fast, whereas the etching rate of the etchant against $SiO_2$ ($R_{SiO2}$) is slow. Therefore, the selectivity ratio ($R_{Si}/R_{SiO2}$) between the etching rates is large. In this case, on reaching a buried oxide film, etching from the bond wafer side automatically almost stops. In this way, use of alkaline etching is advantageous in that a buried oxide film is utilized as a protective film for protecting a base wafer from etching.

DISCLOSURE OF THE INVENTION

It has turned out, however, that removing the unbonded portion by alkaline etching causes metallic contamination, and can deteriorate electric characteristics of semiconductor devices.

The present invention has been accomplished in view of the aforementioned problems, and its object is to provide a method for manufacturing a bonded wafer wherein a selectivity ratio ($R_{Si}/R_{SiO2}$) between an etching rate against Si and an etching rate against $SiO_2$ is large, metallic contamination is not caused, and the unbonded portion of the outer periphery of a bond wafer is etched.

In order to achieve the aforementioned object, the present invention provides a method for manufacturing a bonded wafer comprising steps of forming an oxide film on at least a surface of a base wafer or a surface of a bond wafer; bringing the base wafer and the bond wafer into close contact via the oxide film; subjecting these wafers to a heat treatment under an oxidizing atmosphere to bond the wafers together; grinding and removing the outer periphery of the bond wafer so that the outer periphery has a predetermined thickness; subsequently removing an unbonded portion of the outer periphery of the bond wafer by etching; and then thinning the bond wafer so that the bond wafer has a desired thickness, wherein the etching is conducted by using a mixed acid at 30° C. or less at least comprising hydrofluoric acid, nitric acid, and acetic acid.

In etching the unbonded portion of the outer periphery of the bond wafer by using the mixed acid at 30° C. or less, the etching rate against Si ($R_{Si}$) is fast, whereas the etching rate against $SiO_2$ ($R_{SiO2}$) is slow. That is, the selectivity ratio ($R_{Si}/R_{SiO2}$) between the etching rate against Si and the etching rate against $SiO_2$ is large, and thus the etching rate decreases automatically on reaching a buried oxide film. In this way, the buried oxide film is utilized as a protective film for protecting the base wafer from etching, and the etching does not damage the base wafer. In addition, the etching by using the mixed acid does not cause metallic contamination.

In the above case, the etching is preferably conducted by spin etching.

Unlike the case of etching by dipping, when etching is conducted by spin etching, temperature increase of an etchant caused by the chemical reaction of the etching is small. Thus the etchant is easily controlled within temperatures equal to or less than 30° C., and is sufficiently achieved by using a compact cooling means. Consequently, the etching can be conducted at a lower cost.

In summary, according to the present invention, when the unbonded portion of the outer periphery of the bond wafer is etched by using a mixed acid at 30° C. or less at least comprising hydrofluoric acid, nitric acid, and acetic acid, metallic contamination is not caused, and the selectivity ratio ($R_{Si}/R_{SiO2}$) between the etching rate against Si and the etching rate against $SiO_2$ becomes large. Thus a buried oxide film is utilized as a protective film for protecting the base wafer from etching, and the etching does not damage the base wafer.

BEST MODE FOR CARRYING OUT THE INVENTION

Hereinafter, the present invention will be described further in detail. However, the present invention is not limited thereto.

Those skilled in the art conventionally recognize that etching using a mixed acid is not applicable to the case of etching and removing the unbonded portion of a bond wafer by etch stop method because the method requires a sufficiently high selectivity ratio between etching rates. The present inventors, however, have experimentally studied and found that a sufficiently usable selectivity ratio can be achieved by maintaining the temperature of a mixed acid in low temperatures, and also use of the mixed acid overcomes the problem of metallic contamination caused by alkaline etching. Thus the inventors have accomplished the present invention.

Figure 1:
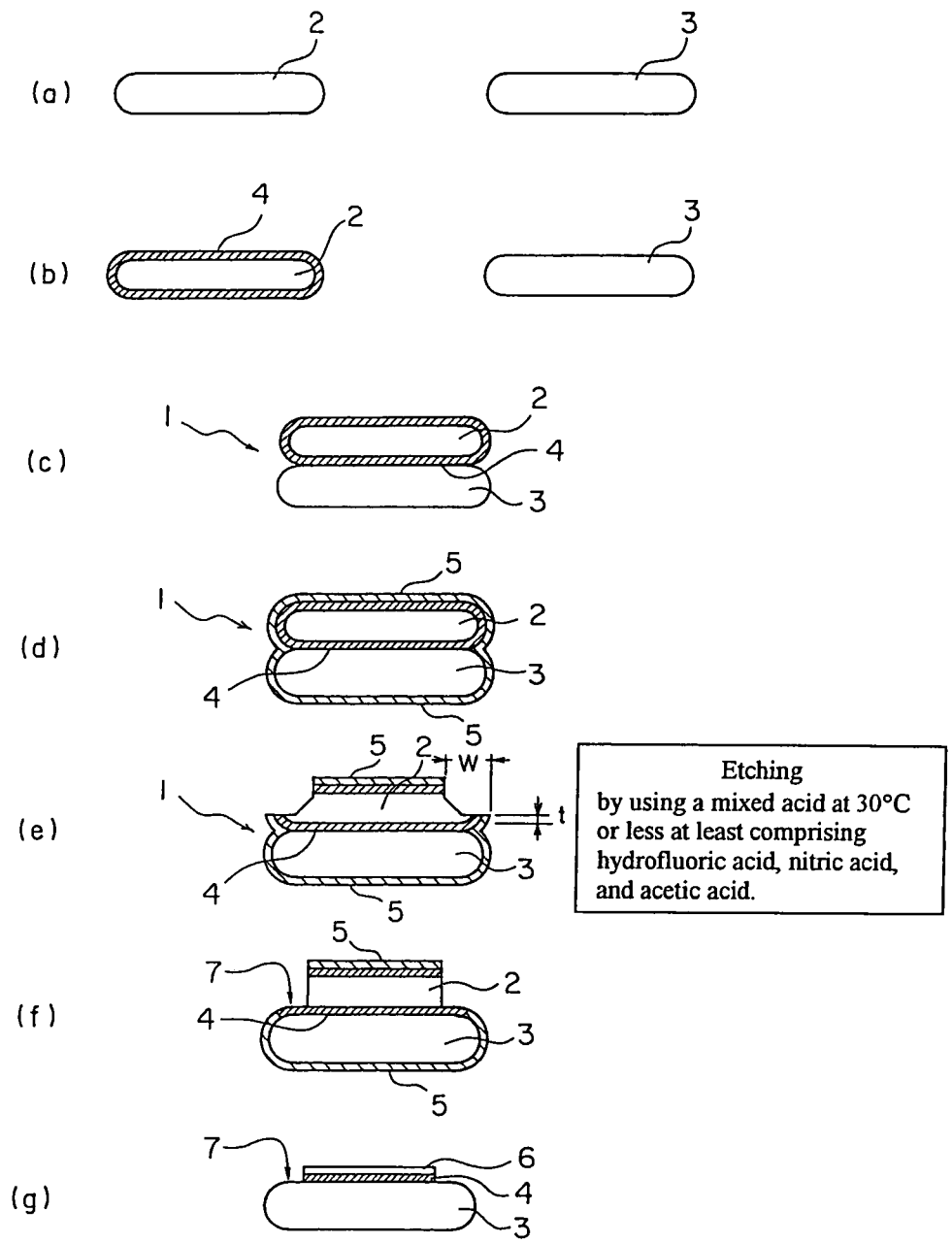
FIGS. 1(a)-(g) are a flow charts showing embodiments of the method for manufacturing a bonded wafer according to the present invention.

FIG. 1 is a schematic view showing an embodiment of the method for manufacturing a bonded wafer according to the present invention.

In FIG. 1, a bond wafer 2 and a base wafer 3 are prepared (FIG. 1(*a*)). The wafers are material wafers for fabricating an SOI wafer by bonding the wafers together. The bond wafer and the base wafer are not particularly restricted. For example, the wafers may be silicon single crystal wafers.

Next, among the prepared silicon single crystal wafers, the bond wafer 2 is subjected to a heat treatment to form an oxide film 4 on the surface of the bond wafer (FIG. 1(*b*)). The oxide film may be formed on the base wafer, or may be formed on both of the bond wafer and the base wafer.

Then the bond wafer 2 on which the oxide film is formed and the base wafer 3 are brought into close contact under a clean atmosphere (FIG. 1(*c*)). These wafers are subjected to a heat treatment under an oxidizing atmosphere to bond firmly the bond wafer 2 and the base wafer 3 together. Thus a bonded wafer 1 is obtained. The heat treatment may be conducted, for example, under conditions of an atmosphere containing oxygen or water vapor and at a temperature in the range of 200° C. to 1200° C. (FIG. 1(*d*)). As a result of the heat treatment, the bond wafer 2 and the base wafer 3 are bonded firmly together, and an oxide film (a bonding oxide film) 5 is formed on the whole outer surface of the bonded wafer 1.

The bonded wafer 1 thus bonded has portions where the bond wafer 2 and the base wafer 3 are not bonded in the region within 2 mm from the outer periphery. Such unbonded portions cannot be used as an SOI layer on which devices are fabricated. Furthermore, the unbonded portions delaminate in subsequent processes which further cause various problems. Therefore, the unbonded portions must be removed.

In order to remove the unbonded portions, as shown in FIG. 1(*e*), the outer periphery where the unbonded portions exist of the bond wafer 2 is first ground and removed so that the outer periphery has a predetermined width w and a predetermined thickness t. Grinding is used because rapid removal is possible and processing accuracy is good.

In the above case, the predetermined thickness t may be 20 to 150 μm.

Next, etching is conducted to provide a wafer shown in FIG. 1(*f*) in which the unbonded portions of the outer periphery of the bond wafer 2 are removed. The etchant used herein in the present invention is a mixed acid at 30° C. or less at least comprising hydrofluoric acid, nitric acid, and acetic acid. For example, a mixed acid such as an aqueous solution comprising hydrofluoric acid:nitric acid:acetic acid=15 wt %:47 wt %:5 wt % is preferably used. The mixed acid may further comprise phosphoric acid, sulfuric acid, or the like in addition to hydrofluoric acid, nitric acid, and acetic acid.

Figure 2:
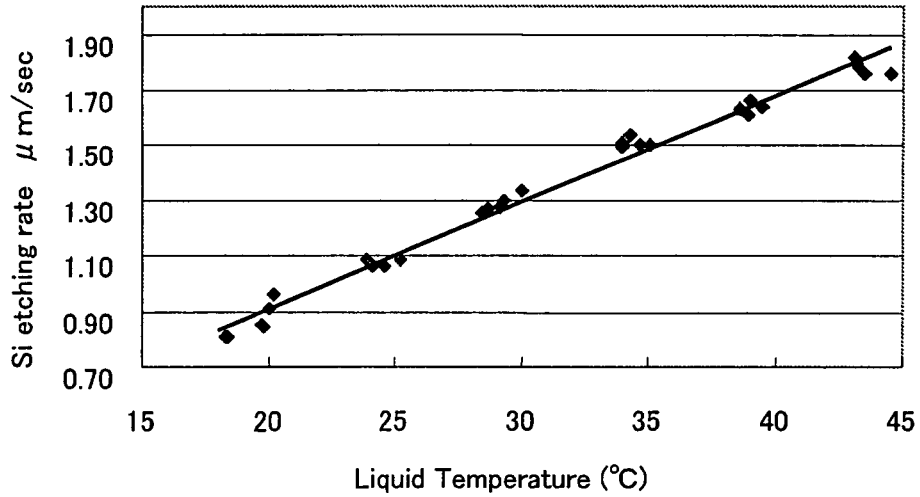
FIG. 2(a) is a graph showing the relationship between the liquid temperature of a mixed acid and its etching rate against Si ($R_{Si}$).
FIG. 2(b) is a graph showing the relationship between the liquid temperature of a mixed acid and its etching rate against $SiO_2$ ($R_{SiO2}$).
Figure 2:
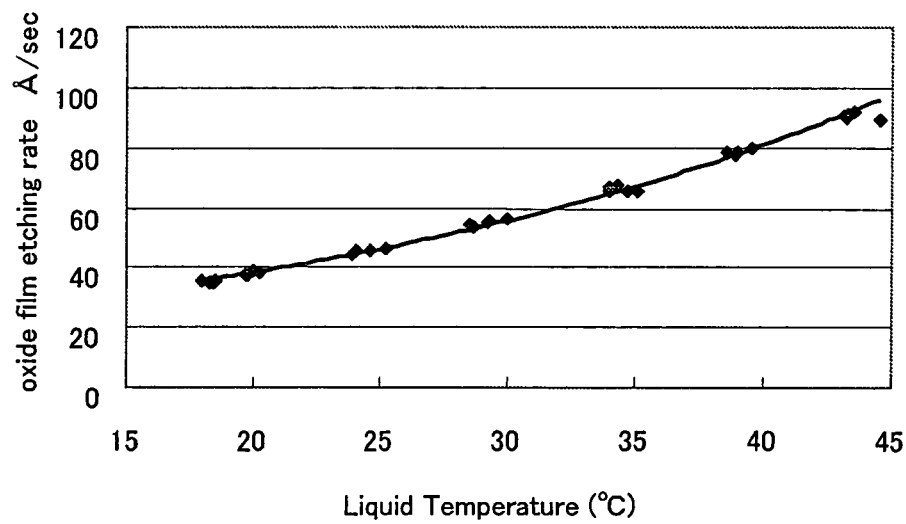

Bonded wafers were etched by using the mixed acid to investigate the relationship between the liquid temperature and the etching rate of the mixed acid. FIG. 2(*a*) shows measurement results of the relationship between the liquid temperature of the mixed acid and its etching rate against Si ($R_{Si}$). FIG. 2(*b*) shows measurement results of the relationship between the liquid temperature of the mixed acid and its etching rate against $SiO_2$ ($R_{SiO2}$). In addition, based on the data of FIGS. 2(*a*) and 2(*b*), the relationship between the liquid temperature of the mixed acid and the selectivity ratio ($R_{Si}/R_{SiO2}$) between the etching rates was obtained and the results are shown in FIG. 3.

In etching, the selectivity ratio between etching rates against silicon and oxide film is important. When the selectivity ratio is sufficiently large, for example, in FIG. 1(*e*), etching from the bond wafer 2 reaches the buried oxide film between the bond wafer 2 and the base wafer 3, the etching rate considerably decreases and the etching process substantially stops. That is, the oxide film functions as an etch stop layer and protects the base wafer from etching. Consequently, such problems do not occur in which etching proceeds in a short time and damages the base wafer.

Figure 3:
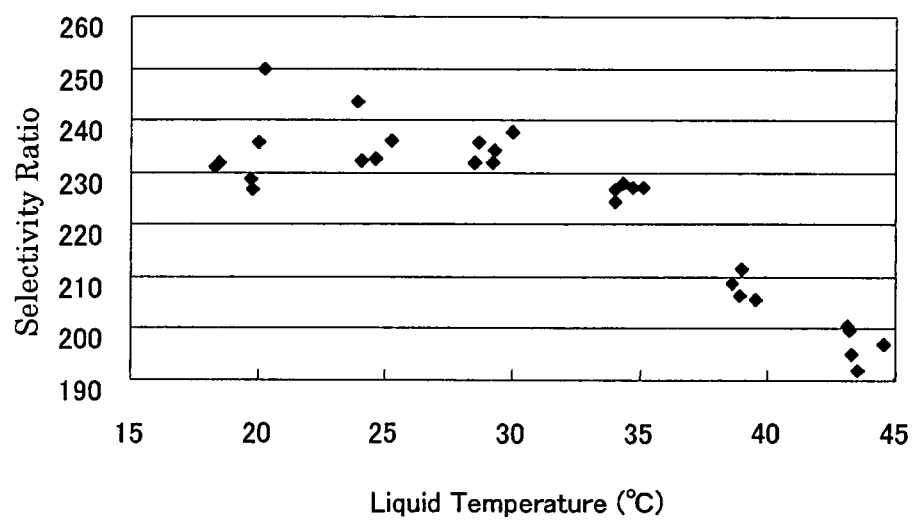
FIG. 3 is a graph showing the relationship between the liquid temperature of a mixed acid and the selectivity ratio ($R_{Si}/R_{SiO2}$) between the etching rates.

As shown in FIG. 3, the selectivity ratio of the mixed acid sharply drops in temperatures greater than 30° C. When etching is conducted in temperatures greater than 30° C., the etching does not stop sharply on reaching the oxide film because the film does not function as an etch stop layer. As a result, problems occur such that etching proceeds in a short time and damages the base wafer, or dimples are generated in the terrace region of the base wafer.

In contrast, as shown in FIG. 3, the etchant having a liquid temperature of 30° C. or less exhibits sufficiently large selectivity ratio, and the oxide film functions as an etch stop layer. Thus the etching stops sharply on reaching the oxide film, and the etching does not damage the base wafer protected by the oxide film, and dimples are not generated in the terrace region of the base wafer.

The lower limit of the liquid temperature of the etchant is not particularly restricted, and any temperature is fine as long as etching can be conducted without any trouble.

Use of the mixed acid as an etchant according to the present invention does not cause metallic contamination. Conventional alkaline etching using NaOH, KOH, or the like as an etchant gives rise to a problem because such etching causes metallic contamination, and leads to deterioration of the electric characteristics of semiconductor devices. In contrast, etching using the mixed acid according to the present invention does not cause metallic contamination, and yield can be increased.

The method of conducting etching by using the mixed acid according to the present invention is not particularly restricted, but spin etching is preferable. Unlike dipping, liquid temperature increase of an etchant caused by chemical reaction occurred in etching is small. In order to maintain the liquid temperature of an etchant equal to or less than 30° C., compact cooling equipment will suffice, and excessive operation cost for cooling equipment is not necessary. This enables reduction of equipment size and labor savings, thereby carrying out the present invention at low cost. Also, it is certainly possible to conduct the mixed acid etching by dipping.

Hereinafter, there is described an embodiment of the case of conducting the mixed acid etching by spin etching. An apparatus for conducting the spin-etching is not particularly restricted, and for example, an apparatus shown in FIG. 5 may be used. Etching is conducted as follows: the bonded wafer 1 is held by suction by using a wafer holding means 10; an etchant 9 is provided from a nozzle 8; and the bonded wafer 1 is spun at high rotational speed. In this way, the wafer is etched by rotating the wafer, whereby centrifugal force scatters the etchant 9 outward of the wafer. The scattered etchant 9 is recovered via a recovery cup 11.

Specifically, it is preferred to rotate a bonded wafer, the base wafer side of which is held by suction, by using a spin etching apparatus at 300 to 400 rpm while a mixed acid is fed to the upper surface of the bond wafer from a nozzle at a flow rate of 3 to 4 L/minute for 5 seconds or more depending on an intended etching removal.

Next, after the etching is conducted for a predetermined period to remove the unbonded portion, the wafer is rinsed to quench the mixed acid etching. For example, it is preferred to rotate the wafer subjected to the mixed acid etching at 500 to 700 rpm while pure water is fed to the upper surface of the bond wafer from a nozzle at a flow rate of 1 to 2 L/minute for 30 to 40 seconds.

Next, the wafer is dried. The rinsed wafer can be spin dried, for example, by rotating the wafer at 1400 to 1600 rpm for 30 to 50 seconds. After the wafer is spin dried, the wafer is removed from the spin etching apparatus. Thus the spin etching step is complete.

As a result of the etching, a terrace region 7 is formed (FIG. 1(f)).

Next, as shown in FIG. 1(g), the surface of the bond wafer 2 is thinned so that the bond wafer has a desired thickness to form an SOI layer 6. The manner of thinning the bond wafer is not particularly restricted, and can be conducted by a standard manner such as grinding and polishing.

In this way, a bonded wafer according to the present invention can be manufactured.

The present invention is not restricted to the above mentioned method of conducting the mixed acid etching by spin etching. For example, the present invention can be conducted by the dipping method of dipping a wafer into an etchant to etch the wafer, or by spraying a mixed acid.

In the method mentioned above, the oxide film 4 is formed on the bond wafer 2, and then the bond wafer 2 is brought into close contact with the base wafer 3. Alternatively, an oxide film is formed on the base wafer 3 and then the base wafer 3 is brought into close contact with the bond wafer 2; or oxide films are formed on both the bond wafer 2 and the base wafer 3 and then the wafers are brought into close contact with each other. The base wafer and the bond wafer that are used in the present invention are not restricted to silicon single crystal wafers.

EXAMPLES

Hereinafter, Examples of the present invention will be described. However, the present invention is not restricted thereto.

Example

Comparative Example

First, mirror-polished CZ wafers each having a diameter of 200 mm, conductivity type: p-type, and a resistivity of 4 to 6 Ω·cm were prepared. These wafers were used as a base wafer and a bond wafer.

These wafers were brought into close contact with each other according to the steps (a) to (c) in FIG. 1. Then the wafers were subjected to a bonding heat treatment at 1150° C. under an oxygen atmosphere for 3 hours to prepare a bonded wafer 1 in FIG. 1(d).

Next, as shown in FIG. 1(e), the outer periphery of the bond wafer 2 was ground by using a grinding machine from the outer periphery toward the center of the wafer. The thickness t was 50 μm.

Then unbonded portions in the outer periphery of the bond wafer 2 were removed by etching.

Figure 5:
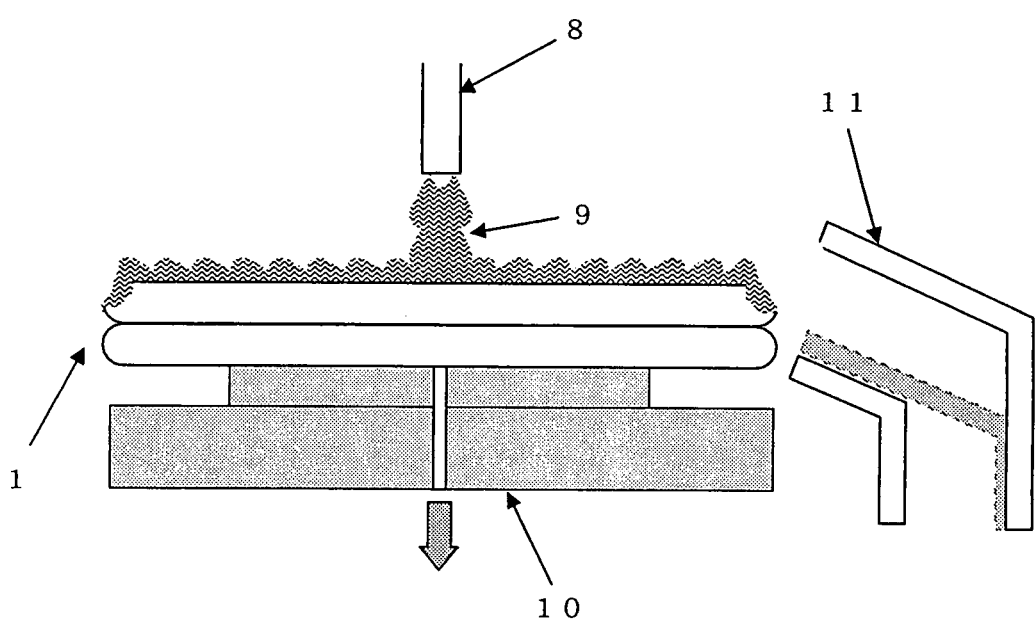
FIG. 5 is a single-wafer-processing spin-etching apparatus that can be used in the method for manufacturing a bonded wafer according to the present invention.

In the Example, etching was conducted by using a spin etching apparatus shown in FIG. 5 while a mixed acid (an aqueous solution of hydrofluoric acid:nitric acid:acetic acid=15 wt %:47 wt %:5 wt %) was used as an etchant and the liquid temperature was maintained at 23° C. (room temperature) by using a compact cooling apparatus. This mixed acid etching was conducted by rotating the bonded wafer at 350 rpm, the base wafer side of which was held by suction, and feeding the mixed acid to the upper surface of the bond wafer at a flow rate of 3.5 L/minute over 86 seconds. The etching removal was about 100 μm.

In the Comparative Example, alkaline etching was conducted under the same conditions as those in the Example except that NaOH was used as the etchant.

Then in order to quench the etching, the bonded wafer was rinsed by rotating the wafer at 600 rpm and feeding pure water to the upper surface of the bond wafer from a nozzle at a flow rate of 1 L/minute over 35 seconds.

Then the rinsed bonded wafer was dried by rotating the wafer at 1500 rpm for 30 seconds. Thus the spin etching step was complete.

Next, the surface of the bond wafer 2 was thinned by grinding and polishing by using a surface grinding machine and a single-side polishing machine to form an SOI layer 6. Thus a wafer shown in FIG. 1(g) was obtained.

(Microscopic Observation of Terrace Region)

The terrace regions of the SOI wafers obtained in the Example and the Comparative Example were inspected for the presence of dimples by using an optical microscope. As a result, dimples were hardly observed in both of the wafers. It has been established that use of the method according to the present invention enables etch stop as with the case of conducting alkaline etching and removal of unbonded portions by etching with sufficiently high selectivity ratio.

(Evaluation of Metallic Contamination)

Figure 4:
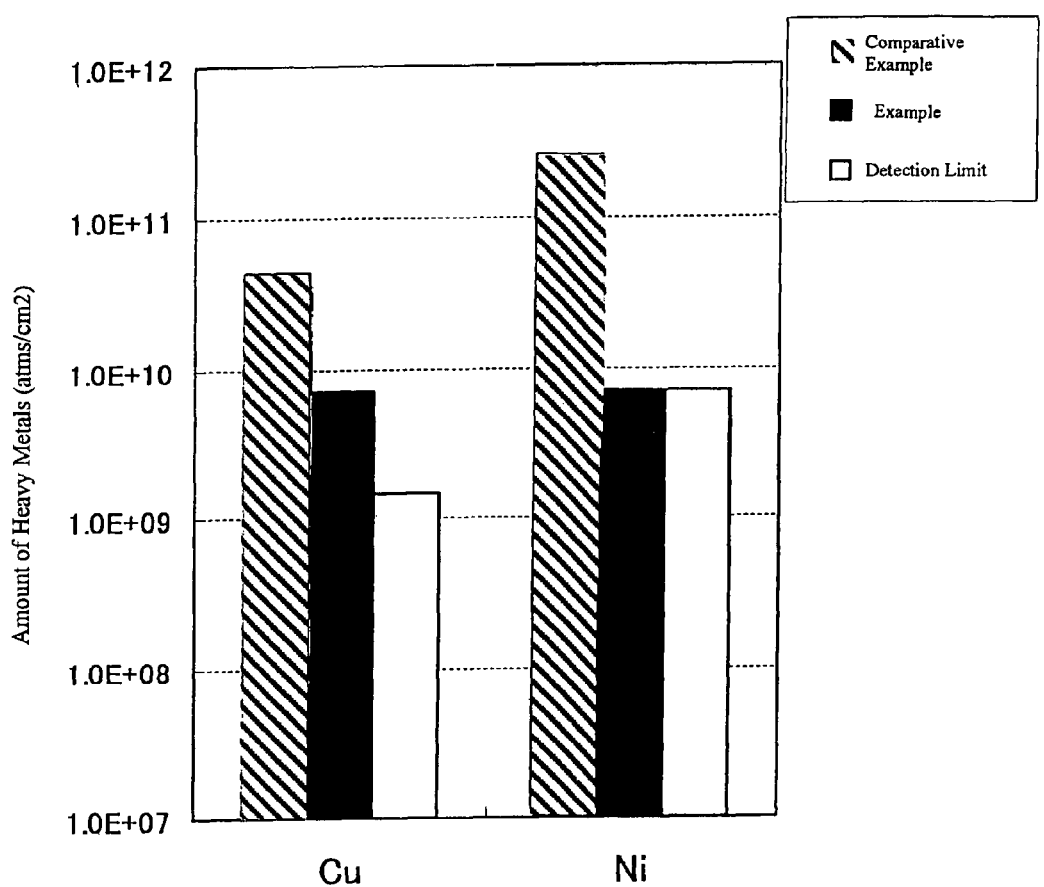
FIG. 4 is a graph showing evaluation results of metallic contamination in Example and Comparative Example.

The bonded wafers obtained in the Example and the Comparative Example were evaluated in terms of metallic contamination by atomic absorption method. The obtained results are shown in FIG. 4. As is evident from FIG. 4, metallic contamination occurred in the Comparative Example where alkaline etching was conducted, whereas almost little or no metallic contamination occurred in the Example where the mixed-acid etching according to the present invention was conducted.

It should be noted that the present invention is not limited to the embodiments described above. The above-described embodiments are mere examples, and those having substantially the same structure as technical ideas described in the appended claims and providing the similar functions and advantages are included in the scope of the present invention.

The invention claimed is:

1. A method for manufacturing a bonded wafer comprising steps of:
    forming an oxide film on at least a surface of a base wafer or a surface of a bond wafer;
    bringing the base wafer and the bond wafer into close contact via the oxide film;

subjecting these wafers to a heat treatment under an oxidizing atmosphere to bond the wafers together;
grinding and removing the outer periphery of the bond wafer so that the outer periphery has a predetermined thickness;
subsequently removing an unbonded portion of the outer periphery of the bond wafer by etching; and then
thinning the bond wafer so that the bond wafer has a desired thickness,
wherein the etching to remove the unbonded portion of the outer periphery of the bond wafer is conducted by using a mixed acid at least comprising hydrofluoric acid, nitric acid, and acetic acid, and maintaining the temperature of the mixed acid at 23° C. to 30° C. until the etching stops on reaching the oxide film.

2. The method for manufacturing a bonded wafer according to claim 1, wherein the etching is conducted by spin etching.

* * * * *